(12) United States Patent
Jäntti

(10) Patent No.: US 11,777,630 B2
(45) Date of Patent: Oct. 3, 2023

(54) RADIO COMMUNICATIONS

(71) Applicant: Nordic Semiconductor ASA, Trondheim (NO)

(72) Inventor: Joni Jäntti, Trondheim (NO)

(73) Assignee: Nordic Semiconductor ASA, Trondheim (NO)

( * ) Notice: Subject to any disclaimer, the term of this patent is extended or adjusted under 35 U.S.C. 154(b) by 253 days.

(21) Appl. No.: 17/047,311

(22) PCT Filed: Apr. 9, 2019

(86) PCT No.: PCT/EP2019/058987
§ 371 (c)(1),
(2) Date: Oct. 13, 2020

(87) PCT Pub. No.: WO2019/197420
PCT Pub. Date: Oct. 17, 2019

(65) Prior Publication Data
US 2021/0119719 A1    Apr. 22, 2021

(30) Foreign Application Priority Data

Apr. 13, 2018    (GB) ...................................... 1806129

(51) Int. Cl.
H04J 3/06    (2006.01)
H03M 1/12   (2006.01)
H04L 7/00    (2006.01)

(52) U.S. Cl.
CPC ......... *H04J 3/0685* (2013.01); *H03M 1/1255* (2013.01); *H04J 3/0629* (2013.01); *H04L 7/0008* (2013.01); *H04L 7/0079* (2013.01)

(58) Field of Classification Search
CPC ............................ H04J 3/0685; H03M 1/1255
See application file for complete search history.

(56) References Cited

U.S. PATENT DOCUMENTS

2010/0074311 A1* 3/2010 Kopmeiners ............ H04B 1/40
                                                            375/220
2011/0150158 A1    6/2011 Yamagiuchi
(Continued)

FOREIGN PATENT DOCUMENTS

CN    104969472 A    10/2015
EP    0 818 904 A2    1/1998
(Continued)

OTHER PUBLICATIONS

International Search Report and Written Opinion for PCT/EP2019/058987, dated Jul. 22, 2019, 16 pages.
(Continued)

*Primary Examiner* — Abdeltif Ajid
(74) *Attorney, Agent, or Firm* — Klarquist Sparkman, LLP

(57) ABSTRACT

A radio receiver device comprises an analogue-to-digital converter clocked by a first clock signal which receives a radio signal. A digital circuit portion receives a digital signal produced by the analogue-to-digital converter and comprises digital processing units clocked by a second clock derived from the first clock and which produce an output signal at an output sample rate. A counter clocked by the second clock counts samples at the output sample rate. A network timer clocked by a reference of a network clock produces a receiver enable flag synchronised to the first clock. The counter is enabled when the flag is set and sets a trigger flag when the count exceeds a predetermined threshold. A buffer receives the output signal and is enabled when the trigger flag is set.

15 Claims, 4 Drawing Sheets

(56) References Cited

U.S. PATENT DOCUMENTS

2011/0294454 A1 12/2011 Robert
2014/0126615 A1* 5/2014 Agami ................. H04J 3/0685
375/222
2014/0177609 A1 6/2014 Vandenameele et al.

FOREIGN PATENT DOCUMENTS

EP    2 154 788 A2   2/2010
WO   WO 96/25802 A2  8/1996

OTHER PUBLICATIONS

IPO Search Report under Section 17(5) for GB1806129.1, dated Oct. 22, 2018, 4 pages.

* cited by examiner

RADIO COMMUNICATIONS

CROSS REFERENCE TO RELATED APPLICATIONS

This is the U.S. National Stage of International Application No. PCT/EP2019/058987, filed Apr. 9, 2019, which was published in English under PCT Article 21(2), which in turn claims the benefit of Great Britain Application No. 1806129.1, filed Apr. 13, 2018.

TECHNICAL FIELD

The present invention relates to receiving data packets via a radio communications network, in particular a cellular network such as a Long Term Evolution (LTE) network, and specifically to addressing offsets between local timing and network timing.

BACKGROUND

Throughout the course of the past few decades, the extent and technical capabilities of cellular-based radio communication systems have expanded dramatically. A number of different cellular-based networks have been developed over the years, including the Global System for Mobile Communications (GSM), General Packet Radio Services (GPRS), Enhanced Data rates for GSM Evolution (EDGE), and Universal Mobile Telecommunications System (UMTS), where GSM, GPRS, and EDGE are often referred to as second generation (or "2G") networks and UMTS is referred to as a third generation (or "3G") network.

More recently, the Long Term Evolution (LTE) network, a fourth generation (or "4G") network standard specified by the $3^{rd}$ Generation Partnership Project (3GPP), has gained popularity due to its relatively high uplink and downlink speeds and larger network capacity compared to earlier 2G and 3G networks. More accurately, LTE is the access part of the Evolved Packet System (EPS), a purely Internet Protocol (IP) based communication technology in which both real-time services (e.g. voice) and data services are carried by the IP protocol. The air interface of LTE is often referred to as Evolved UMTS Terrestrial Radio Access (or "E-UTRA").

However, while "classic" LTE connections are becoming increasingly prevalent in the telecommunications industry, further developments to the communication standard are being made in order to facilitate the so-called "Internet of Things" (IoT), a common name for the inter-networking of physical devices, sometimes called "smart devices", providing physical objects that may not have been connected to any network in the past with the ability to communicate with other physical and/or virtual objects. Such smart devices include: vehicles; buildings; household appliances, lighting, and heating (e.g. for home automation); and medical devices.

These smart devices are typically real-world objects with embedded electronics, software, sensors, actuators, and network connectivity, thus allowing them to collect, share, and act upon data. These devices may communicate with user devices (e.g. interfacing with a user's smartphone) and/or with other smart devices, thus providing "machine-to-machine" (or "machine type") communication. However, the development of the LTE standards makes it more practical for them to connect directly to the cellular network.

3GPP have specified two versions of LTE for such purposes in Release 13 of the LTE standard. The first of these is called "NarrowBand IoT" (NB-IoT), sometimes referred to as "LTE Cat NB1", and the second is called "enhanced Machine Type Communication" (eMTC), sometimes referred to as "LTE Cat M1". It is envisaged that the number of devices that utilise at least one of these standards for IoT purposes will grow dramatically in the near future.

From a communications perspective, LTE standards (including NB-IoT and eMTC) use orthogonal frequency division multiple access (OFDMA) as the basis for allocating network resources. This allows the available bandwidth between to be shared between user equipment (UE) that accesses the network in a given cell, provided by a base station, referred to in LTE as an "enhanced node B", "eNodeB", or simply "eNB". OFDMA is a multi-user variant of orthogonal frequency division multiplexing (OFDM), a multiplexing scheme in which the total bandwidth is divided into a number of non-overlapping sub-bands, each having its own sub-carrier frequency. In OFDM, unlike other frequency division multiplexing (FDM) schemes, each of these sub-carriers are orthogonal to one another such that cross-talk between sub-bands is ideally eliminated and removing the need for inter-carrier guard bands.

At the physical layer, in the downlink of an LTE connection, each data frame is 10 ms long and is constructed from ten sub-frames, each of 1 ms duration. Each sub-frame contains two slots of equal length, i.e. two 0.5 ms slots. Each slot (and by extension, each sub-frame and each frame) will typically contain a certain number of "resource blocks" (where each sub-frame has twice as many resource-blocks as a slot and each frame has ten times as many resource blocks as a sub-frame). A resource block is 0.5 ms long in the time domain and is twelve sub-carriers wide in the frequency domain. Generally speaking, there are seven OFDM symbols per slot and thus fourteen OFDM symbols per sub-frame. These resource blocks can be visualised as a grid of "resource elements", where each resource element is $\frac{1}{14}$ ms long and one sub-carrier wide, such that there are eighty-four resource elements per resource block (i.e. seven multiplied by twelve) and one hundred and sixty-eight resource elements per sub-frame.

When a UE (i.e. a radio receiver device) connects to the network, it initially synchronises its time base to the network time base. When reception of the next sub-frame begins, the UE should ideally be arranged to start and stop its reception at the exact times that the sub-frames begin and end respectively. Multimode, multiband radio receivers are typically provided with multiple receiver configurations that support different protocols, bandwidths and/or sample rates. However, conventional receivers known in the art per se provided with multiple configurations typically suffer from their analogue-to-digital converter sample rate becoming asynchronous to the network clock, making it more difficult to provide exactly the right samples for baseband processing (i.e. if the start and stop times do not align correctly). The Applicant has appreciated that improvements to the timing precision of the receiver may be advantageous.

Furthermore, typically the result of analogue-to-digital conversion is digitally filtered and the sample rate is lowered (decimated). However, digital filtering gives rise to transients that are present at the beginning of the output data stream. Such a transient results in data that is effectively useless that is generally removed in baseband processing. The Applicant has appreciated that removing the transient in baseband processing wastes processing resources, memory, and power. Furthermore, uncertainty in the reception start and stop times may also adversely affect the receiver's ability to demodulate incoming signals without further processing.

Some conventional arrangements known in the art per se may use the network clock frequency (30.72 MHz in LTE systems) and make use of relatively powerful digital signal processors (DSPs) in order to 'shift' stored samples backwards and forwards in memory so as to obtain the correct starting point for reception. However, the Applicant has appreciated that this incurs relatively high power requirements, which may be undesirable, and potentially prohibitive, for use in low power applications such as battery-operated portable electronic devices.

SUMMARY OF THE INVENTION

When viewed from a first aspect, the present invention provides a radio receiver device arranged to receive a radio signal modulated with a plurality of data symbols from an incoming bitstream, said radio receiver device comprising:
an analogue circuit portion for connection to an antenna, said analogue circuit portion comprising an analogue-to-digital converter clocked by a first clock signal, wherein the analogue-to-digital converter is arranged to receive the radio signal and produce a digital signal therefrom;
a digital circuit portion arranged to receive the digital signal produced by the analogue-to-digital converter, said digital circuit portion comprising:
one or more digital processing units, clocked by a second clock derived from the first clock, said one or more digital processing units being arranged to process the digital signal and produce an output signal therefrom at an output sample rate;
a network timer clocked by a local reference of an external network clock having a frequency greater than a frequency of the second clock, wherein the network timer is arranged to produce a receiver enable flag;
a resynchroniser arranged to synchronise the receiver enable flag to the first clock to produce a synchronised receiver enable flag; and
a buffer arranged to receive the output signal from the one or more digital processing units, wherein said buffer is enabled only when the synchronised receiver enable flag is set.

This first aspect of the present invention extends to a method of operating a radio signal modulated with a plurality of data symbols from an incoming bitstream, wherein the method comprises:
receiving the radio signal;
converting the radio signal from analogue to digital, thereby producing a digital signal from said radio signal;
processing the digital signal and producing an output signal therefrom at an output sample rate;
producing a receiver enable flag using a network timer clocked by a local reference of an external network clock, wherein a frequency of the external network clock is greater than a frequency of the second clock;
synchronising the receiver enable flag to the first clock to produce a synchronised receiver enable flag;
enabling a buffer arranged to receive the output signal only when the synchronised receiver enable flag is set.

Thus it will be appreciated by those skilled in the art that embodiments of the present invention provide an improved radio receiver device wherein the synchronised receiver enable flag may ensure accurate reception by enabling the receiver according to network time. Radio receiver devices according to at least some embodiments of the present invention advantageously do not need to synchronise their internal time bases to the time base of the network. The resynchroniser acts to synchronise the receiver enable flag to the first clock domain, i.e. to the ADC clock domain, in a manner known in the art per se.

As will be appreciated by those skilled in the art, timing precision of the receiver is improved by starting reception based on the local reference of the network clock rather than the output sample rate because the network clock has a greater frequency than the output sample rate, i.e. the timing resolution is increased. By way of non-limiting example only, the output sample rate may typically be 1.92 MHz, while the network clock may be 30.72 MHz. Therefore, in this particular example, enabling reception based on the network clock rather than the output sample rate may lead to a 16× increase in timing precision. However, the digital processing units (which may, by way of example only, be part of a DSP) may advantageously be clocked at a clock frequency much less than the network clock frequency, which may lead to a reduction in power consumption compared to conventional receivers that use a DSP which uses the network clock frequency as the base sample rate.

Such an arrangement does not rely on the time base of the receiver to be synchronous with the network time base, i.e. the first and second clocks do not need to be synchronised to an external clock signal. The digital processing is carried out in the same clock domain as the analogue-to-digital converter (ADC), but these may, advantageously, be asynchronous to the network time. Having the digital processing in the ADC clock domain is preferred for low power devices, particularly single mode radio receivers, as this may allow decimation to be performed without fractional sample rate conversion.

Embodiments of the present invention also advantageously allow the ADC clock frequency to be varied, for example to avoid interference from harmonics of the ADC clock frequency affecting other systems within the receiver, without affecting the output sample rate seen by downstream circuitry, e.g. baseband processing circuitry.

As the digital processing is synchronous to the ADC, there is no uncertainty of ±1 sample and the radio receiver device may determine exactly when it should be receiving signals. While there may still be a small degree of uncertainty (e.g. ±1 ADC clock period) when synchronised to the ADC clock domain, this uncertainty will typically be much less than a sample when oversampling using an ADC.

The second clock is derived from the first clock such that the digital processing units are within the clock domain of the ADC. This derivation of the second clock from the first clock may be achieved in any suitable way, however in some preferred embodiments, the radio receiver device further comprises a clock divider arranged to divide the frequency of the first clock by a predetermined scale factor to generate the second clock. In the set of embodiments in which the radio receiver device comprises both a network timer as described hereinabove and a clock divider, the clock divider may also be enabled only when the synchronised receiver enable flag is set and may be reset when the clock divider is disabled.

In some embodiments, the radio receiver device further comprises a sample counter clocked by the second clock such that the sample counter counts a number of samples at the output sample rate, said sample counter being arranged to set a trigger flag when the number of samples exceeds a predetermined threshold value; wherein sample counter is enabled only when the synchronised receiver enable flag is set. By waiting until the number of samples exceeds the predetermined threshold value, embodiments of the present invention may wait until after the transient response of the digital circuit portion has passed (i.e. it reaches steady state)

before enabling the buffer that receives the output signal from the digital circuit portion. It will be appreciated that the settling time of the analogue circuit portion is not critical as it typically takes place well before the transient response of the digital circuit portion ends and so does not affect the timing precision. In some preferred embodiments, the buffer is enabled only when both the trigger flag and the synchronised receiver enable flag are set.

Such an arrangement is novel and inventive in its own right and thus, when viewed from a second aspect, the present invention provides a radio receiver device arranged to receive a radio signal modulated with a plurality of data symbols from an incoming bitstream, said radio receiver device comprising:

an analogue circuit portion for connection to an antenna, said analogue circuit portion comprising an analogue-to-digital converter clocked by a first clock signal, wherein the analogue-to-digital converter is arranged to receive the radio signal and produce a digital signal therefrom;

a digital circuit portion arranged to receive the digital signal produced by the analogue-to-digital converter, said digital circuit portion comprising:

one or more digital processing units, clocked by a second clock derived from the first clock, said one or more digital processing units being arranged to process the digital signal and produce an output signal therefrom at an output sample rate;

a sample counter clocked by the second clock such that the sample counter counts a number of samples at the output sample rate, said sample counter being arranged to set a trigger flag when the number of samples exceeds a predetermined threshold value; and wherein the radio receiver further comprises a buffer arranged to receive the output signal from the one or more digital processing units, wherein said buffer is enabled only when the trigger flag is set.

This second aspect of the present invention extends to a method of operating a radio signal modulated with a plurality of data symbols from an incoming bitstream, wherein the method comprises:

receiving the radio signal;

converting the radio signal from analogue to digital, thereby producing a digital signal from said radio signal;

processing the digital signal and producing an output signal therefrom at an output sample rate;

counting a number of samples at the output sample rate;

setting a trigger flag when the number of samples exceeds a predetermined threshold value;

enabling a buffer arranged to receive the output signal only when the trigger flag is set.

Those skilled in the art will appreciate that, in general, digital processing units have an associated transient response. Certain embodiments of the present invention may allow, providing a proper selection of the predetermined threshold value, the transient response to pass before the buffer is provided with the signals produced by the digital processing units. In other words, the transient response can be suppressed such that it does not impact the integrity of the signals provided to the buffer. In some embodiments, the threshold value is selected such that a transient response of the one or more digital processing units is substantially over before the trigger flag is set. It will be appreciated that while, in general, a transient response of a system takes a certain amount of time before reaching a steady state value (assuming proper damping), the term 'substantially over' as used herein with respect to the transient response should be understood to mean that the transient response has no effect on the integrity of the signals provided to the buffer once the trigger flag is set.

A radio receiver device in accordance with such embodiments may also advantageously allow the sample rate to be changed easily. As the sample counter counts samples at the sample rate, the predetermined threshold value may, in some embodiments, be varied when the output sample rate is changed. The Applicant has appreciated that such an arrangement is particularly beneficial for multimode, multiband radio receivers.

These principles are advantageous for a number of different digital processing units, for example digital filters. However, in some embodiments of either of the foregoing aspects of the invention, the one or more digital processing units comprise at least one decimator and at least one sample rate converter.

Multimode, multiband receivers may have multiple receiver configurations so as to support different protocols, bandwidths and sample rates. It may, in some cases, be beneficial to have the possibility to use different clock frequencies, decimation and sample rate conversion rates. In some embodiments of either of the foregoing aspects, the digital circuit portion comprises a plurality of decimators each connected to a separate sample rate converter, such that each decimator may receive the digital signal from the ADC and produce a respective decimated signal that is input to the corresponding sample rate converter that produces a respective converted signal. Each of these pairs of decimators and sample rate converters may be arranged in parallel, wherein a particular pair may be selected so as to provide a particular decimation rate and/or sample rate associated with that pair.

In a set of embodiments, the decimator(s) are clocked by a third clock, said third clock being derived from the first clock, and the sample rate converter(s) are clocked by the second clock. The use of a decimator and a sample rate converter may allow for division of the clock frequency by an integer and non-integer scaling factors respectively.

In some embodiments of either of the foregoing aspects of the invention, the radio receiver device further comprises a baseband circuit portion arranged to retrieve the output signal from the buffer, wherein the baseband circuit portion is clocked by a further clock. Such a baseband circuit portion may be arranged to carry out further processing of the received data, for example to demodulate the signal and recover the data symbols in a manner known in the art per se.

While the baseband circuit portion could, in some less preferred arrangements, run at the same frequency as the receiver and then the buffer may not be needed. In such an arrangement, the baseband circuit portion and the receiver would be running on the same clock—however, this is generally not preferred because doing so may result in it being difficult or potentially impossible to provide dynamic voltage and/or frequency scaling.

In a set of embodiments, the buffer comprises a first-in-first-out (FIFO) buffer arranged to receive and store the output signal from the digital circuit portion at a write rate, and to retrieve and produce the stored output signal at a read rate. In a preferred set of embodiments, the write rate is set by the second clock. The read rate may be set by any downstream circuitry arranged to retrieve the signals stored in the FIFO buffer. For example, in embodiments wherein the radio receiver comprises a baseband circuit portion clocked by a further clock (e.g. a baseband clock) as described hereinabove, the read rate may be set by the baseband clock. The buffer may, however, instead comprise a circular buffer.

In some embodiments of either of the foregoing aspects, the analogue-to-digital converter is arranged to produce an in-phase digital signal and a quadrature digital signal, wherein the one or more digital processing units are arranged to process both the in-phase and quadrature digital signals.

In some embodiments, the analogue circuit portion comprises at least one filter connected between a terminal for connection to the antenna and the analogue-to-digital converter. The analogue circuit portion may comprise a bandpass filter tuned to the carrier frequency of the radio signal in order to remove signals outside the frequency range of interest, for example due to noise or unwanted images of the signal.

In a set of potentially overlapping embodiments, the analogue circuit portion comprises at least one amplifier connected between a terminal for connection to the antenna and the analogue-to-digital converter. An amplification stage may increase the amplitude of the incoming radio signal to a level more suitable for processing by the other components of the radio receiver device.

While it will be appreciated that the principles of the present invention may readily be applied to a wide variety of radio communication methods and protocols, in preferred embodiments the radio signal comprises an LTE signal.

The predetermined threshold value determines how long the radio receiver device waits before enabling the buffer. This value may be predetermined, for example it may be set during a design and testing process. However, in a set of embodiments the predetermined threshold value is variable. The Applicant has appreciated that a variable threshold value may be particularly beneficial for multiband, multimode receivers, in which there are multiple possible configurations, e.g. pairs of decimators and sample rate converters as described above, where each configuration may have a different transient response duration. This advantageously means that the system is not necessarily limited to waiting the duration of the longest possible transient response. Furthermore, by allowing the predetermined threshold value to be varied, a user may tailor this waiting time to a specific implementation or can adjust the degree to which the transient response of the digital processing units is suppressed.

Those skilled in the art will appreciate that the optional features described hereinabove in relation to a particular one of the foregoing aspects of the invention apply equally to the other aspects of the invention as appropriate.

BRIEF DESCRIPTION OF DRAWINGS

Certain embodiments of the invention will now be described, by way of example only, with reference to the accompanying drawings in which.

DETAILED DESCRIPTION

Figure 1:
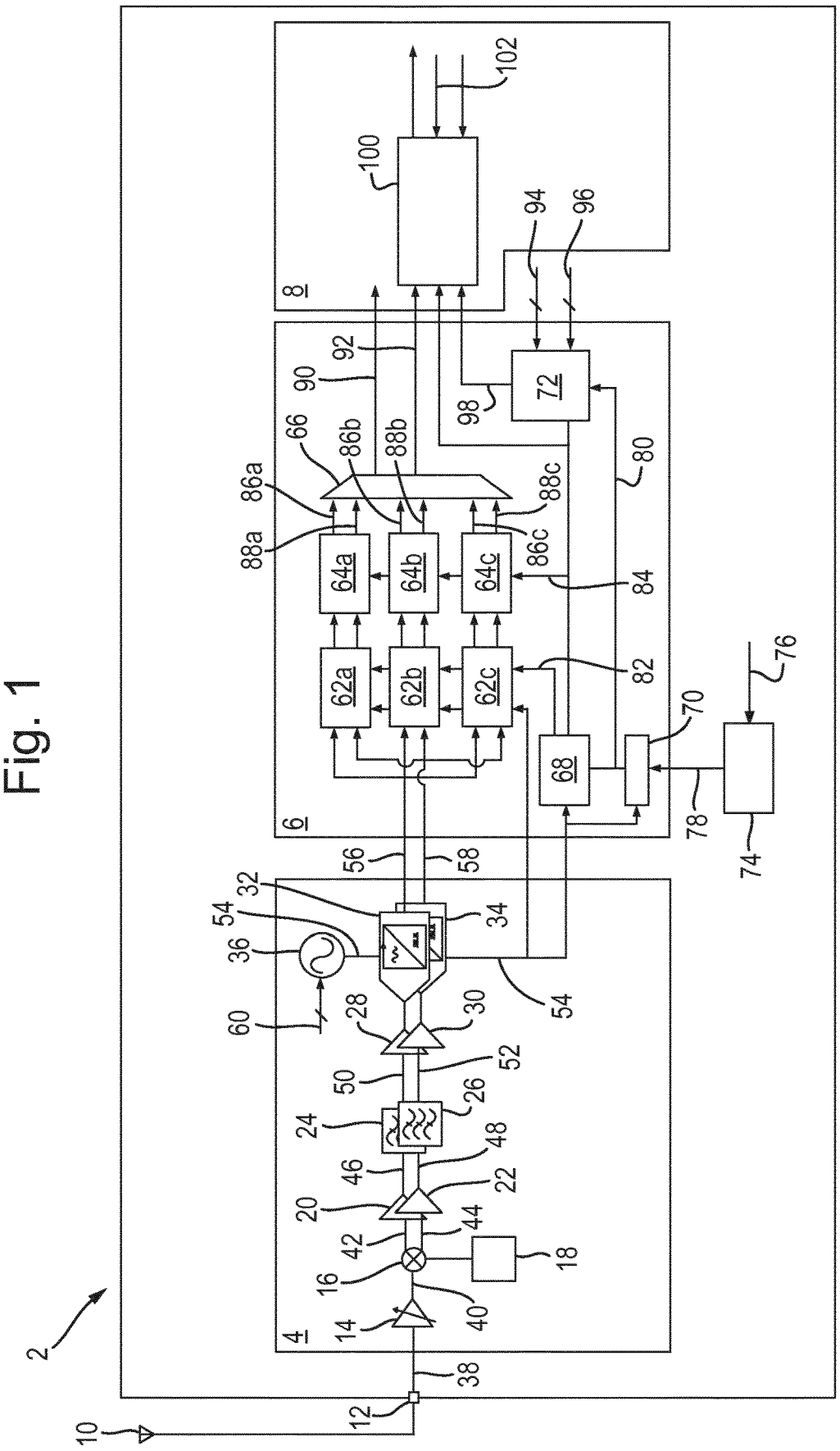
FIG. 1 is a block diagram of a radio receiver device in accordance with an embodiment of the present invention.

FIG. 1 is a block diagram of a radio receiver device 2 in accordance with an embodiment of the present invention.

The receiver 2 is implemented as a system-on-chip (SoC) and comprises: an analogue circuit portion 4, which is an RF front-end of the receiver 2; a digital circuit portion 6; and a baseband circuit portion 8. The structure and operation of each of these circuit portions 4, 6, 8 are described in turn below.

The analogue RF front-end circuit portion 4 is arranged to be connected to an antenna 10 via an antenna terminal 12 for receiving LTE radio signals received over-the-air. The analogue circuit portion 4 comprises: a variable gain pre-amplifier 14; a mixer 16; a local oscillator 18; an in-phase amplifier 20; a quadrature amplifier 22; two bandpass filters 24, 26; two further amplifiers 28, 30; an in-phase ADC 32, a quadrature ADC 34; and a variable clock source 36.

When an incoming LTE radio signal 38 is received via the antenna 10, it is first input to the variable gain pre-amplifier 14 which amplifies the signal 38 to a level suitable for processing by downstream circuitry. Typically, the variable gain pre-amplifier 14 is a low-noise amplifier (LNA), a type of amplifier known in the art per se that is particularly suited to amplifying a signal of interest while rejecting unwanted noise.

The resulting amplified signal 40 is input to the mixer 16, which is also arranged to receive a signal 42 generated by the local oscillator 18 as a further input. The signal 42 generated by the local oscillator 18 is set to the frequency of interest (i.e.

the carrier frequency associated with the channel to which the receiver 2 is currently tuned). This downmixes the amplified signal 38 to baseband and also splits the signal into an in-phase signal 42 and a quadrature signal 44.

The in-phase signal 42 and the quadrature signal 44 are passed through the in-phase amplifier 20 and the quadrature amplifier 22 respectively to provide further amplification of each of these signals 42, 44. The resulting amplified in-phase signal 46 and amplified quadrature signal 48 are each passed through a respective band-pass filter 24, 26, where the bandpass filters 24, 26 are tuned to reject signals outside a particular frequency range. This results in a filtered in-phase signal 50 and a filtered quadrature signal 52.

After subjecting the filtered signals 50, 52 to a further amplification stage 28, 30, the in-phase and quadrature signals 50, 52 are input to the in-phase ADC 32 and the quadrature ADC 34 respectively. These ADCs, clocked by an ADC clock signal 54 produced by the variable clock source 36, convert the analogue signals 50, 52 to an digital in-phase signal 56 and a digital quadrature signal 58. The resulting digital signals 56, 58 are then input to the digital circuit portion 6.

The frequency of the clock signal 54 produced by the variable clock source 36 can be varied by setting a control signal 60 to a desired value. In this example, the control signal 60 is an n-bit control word, and the value that the word is set to determines which frequency, selected from a predetermined discrete range, that the variable clock source 36 generates.

The digital circuit portion 6 comprises: three decimators 62a, 62b, 62c; three sample rate converters 64a, 64b, 64c; a multiplexer 66; a clock divider 68; a re-synchroniser 70; and a sample counter 72. The operation of the digital circuit portion 6 and each of its components is outlined in detail below.

The digital circuit portion 6 is also connected to a network timer 74 which is clocked by a network clock signal 76. The network timer 74 counts pulses of the network clock signal 76 and produces a receiver enable signal 78 that is input to the re-synchroniser 70. The re-synchroniser 70 is clocked by the same ADC clock signal 54 that is used to clock the ADCs 32, 34 in the analogue circuit portion 4. The re-synchroniser then provides a synchronised receiver enable signal 80 that is synchronised to the ADC clock signal 54 as described in further detail with reference to FIG. 3. This synchronised receiver enable signal 80 is used to enable the clock divider 68 and the sample counter 72. Specifically, the clock divider 68 and sample counter 72 are held in reset until the synchronised receiver enable signal 80 is set high. This synchronised receiver enable signal 80 acts as a flag and, once set, releases the clock divider 68 and sample counter 72 from reset. The network timer 74 and re-synchroniser 70 thus determine the time at which reception occurs at the resolution of the network clock signal 76, which is typically much greater than the resolution of the sample rate clock signal 84, and may be greater than the resolution of the ADC clock signal 54 and the decimator clock signal 82, where the function of these clock signals is described below. The network clock signal itself may be, for example, 30.72 MHz, while the output sample rate may be significantly less, for example 1.92 MHz. This may reduce the power consumption of the radio receiver device 2 compared to conventional receivers, which typically operate with the sample rate being comparable to the network clock frequency.

The clock divider 68 is arranged to divide the ADC clock signal 54 by a predetermined scaling factor and produce a decimator clock signal 82 and a sample rate clock signal 84. The decimator clock signal 82 is used to clock the decimators 62a, 62b, 62c; and the sample rate clock signal 84 is used to clock the sample rate converts 64a, 64b, 64c and the sample counter 72.

Each of the decimators 62a, 62b, 62c is connected to an associated sample rate converter 64a, 64b, 64c respectively. The decimators 62a, 62b, 62c and associated sample rate converters 64a, 64b, 64c downsample the digital in-phase signal 56 and the digital quadrature 58 which are input to each of the decimators 62a, 62b, 62c. The individual pairs of decimators 62a, 62b, 62c and sample rate converters 64a, 64b, 64c each provide a different decimation rate and sample rate so as to support different reception modes.

For example, the first pair 62a, 64a may provide a sample rate of 7.68 MHz for LTE in the 5 MHz bandwidth mode; the second pair 62b, 64b may provide a sample rate of 15.36 MHz for LTE in the 10 MHz bandwidth mode; and the third pair 62c, 64c may provide a sample rate of 30.72 MHz for LTE in the 20 MHz bandwidth mode.

The resulting downsampled in-phase signals 86a, 86b, 86c and quadrature signals 88a, 88b, 88c are input to the multiplexer 66. This multiplexer 66 can be controlled so as to select one of the pairs of decimators 62a, 62b, 62c and associated sample rate converters 64a, 64b, 64c to take the corresponding in-phase signals 86a, 86b, 86c and quadrature signals 88a, 88b, 88c as an in-phase output signal 90 and an quadrature output signal 92.

The sample counter 72 is clocked by the sample rate clock signal 84 and is provided with a delay value 94 and a sample size value 96 as inputs. The delay value 94 determines how long the receiver 2 waits for the transient behaviour of the digital circuit portion 6 to subside. The purpose of the sample size value 96 is explained later.

In general, the delay value 94 may vary depending on which pair of decimators 62a, 62b, 62c and associated sample rate converters 64a, 64b, 64c is selected, as each pair may have a different transient duration associated with it.

The sample counter 72 is arranged such that, once it is released from reset, it counts the number of pulses of the sample rate clock signal 84. Once the number of pulses reaches the delay value 94, the sample counter 72 sets a trigger flag 98 to logic high. This trigger flag 98 is used to indicate that the transient response of the digital circuit portion 6 has passed, for example following power-up of the receiver device 2 or after waking the receiver 2 from a low power mode or after activating the radio receiver device 2 in order to receive a scheduled sub-frame.

The baseband circuit portion 8 comprises a dual-clock asynchronous FIFO 100. The FIFO 100 is a buffer, arranged to store the samples of the in-phase output signal 90 and the quadrature output signal 92 produced by the digital circuit portion 6. The FIFO 100 has a write rate clocked by the sample rate clock signal 84 and a read rate clocked by a baseband clock signal 102. An enable input of the FIFO 100 is connected to the output of the sample counter 72 such that the trigger flag 98 enables writing to the FIFO 100 when set.

Figure 2:
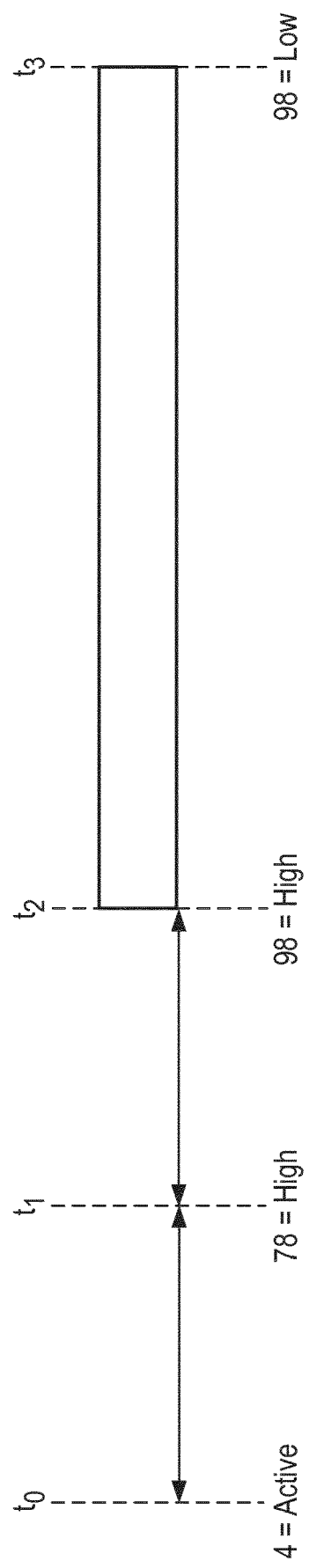
FIG. 2 is a high level timing diagram showing the operation of the device of FIG. 1.

FIG. 2 is a high level timing diagram showing the operation of the device 2 of FIG. 1, which is described in further, low level detail below with reference to FIG. 3. At an initial time $t_0$, the analogue circuit portion 4 of the receiver 2 is enabled. The settling time of the analogue circuit portion 4 is designed so that analogue circuit portion 4 is stable when reception starts but not too early in order to minimise the power consumption of the radio receiver device 2. This settling time is typically determined during the design phase in a manner known in the art per se.

A critical timing event happens at $t_1$ when the digital circuit portion 6 is enabled by the network timer 74 once it sets the receiver enable signal 78 to logic high. At $t_1$ the clock divider 68, decimators 62a, 62b, 62c, sample rate converters 64a, 64b, 64c and sample counter 72 are all enabled.

However, the FIFO 100 is not yet enabled at this time because otherwise the baseband circuit portion 8 would receive the initial transient response of the digital circuit portion 6 (e.g. the transient response of decimators 62a, 62b, 62c and sample rate converters 64a, 64b, 64c) rather than the received signal.

The sample counter 72 gates the FIFO 100 between $t_1$ and $t_2$ and waits until the received signal has propagated through the digital circuit portion 6 and the transient response has faded away (i.e. that it has settled to steady state). As discussed above, the sample counter 72 is set to wait for a certain amount of time set by the delay value 94. Once the predetermined delay has elapsed (i.e. the appropriate number of periods of the sample rate clock signal 84 have exceeded the threshold set by the delay value 94), the sample counter 72 sets the trigger flag 98 exactly at $t_2$, indicating that it is time for the FIFO 100 to receive incoming data (e.g. the LTE frame or sub-frame). The sample counter 72 counts the incoming samples until it reaches the amount set by the sample size value 96 which indicates that the requisite number of samples (e.g. corresponding to an LTE frame or sub-frame as appropriate) have been received, at which point the trigger flag 98 is set to logic low, disabling writing to the FIFO 100.

Figure 3:
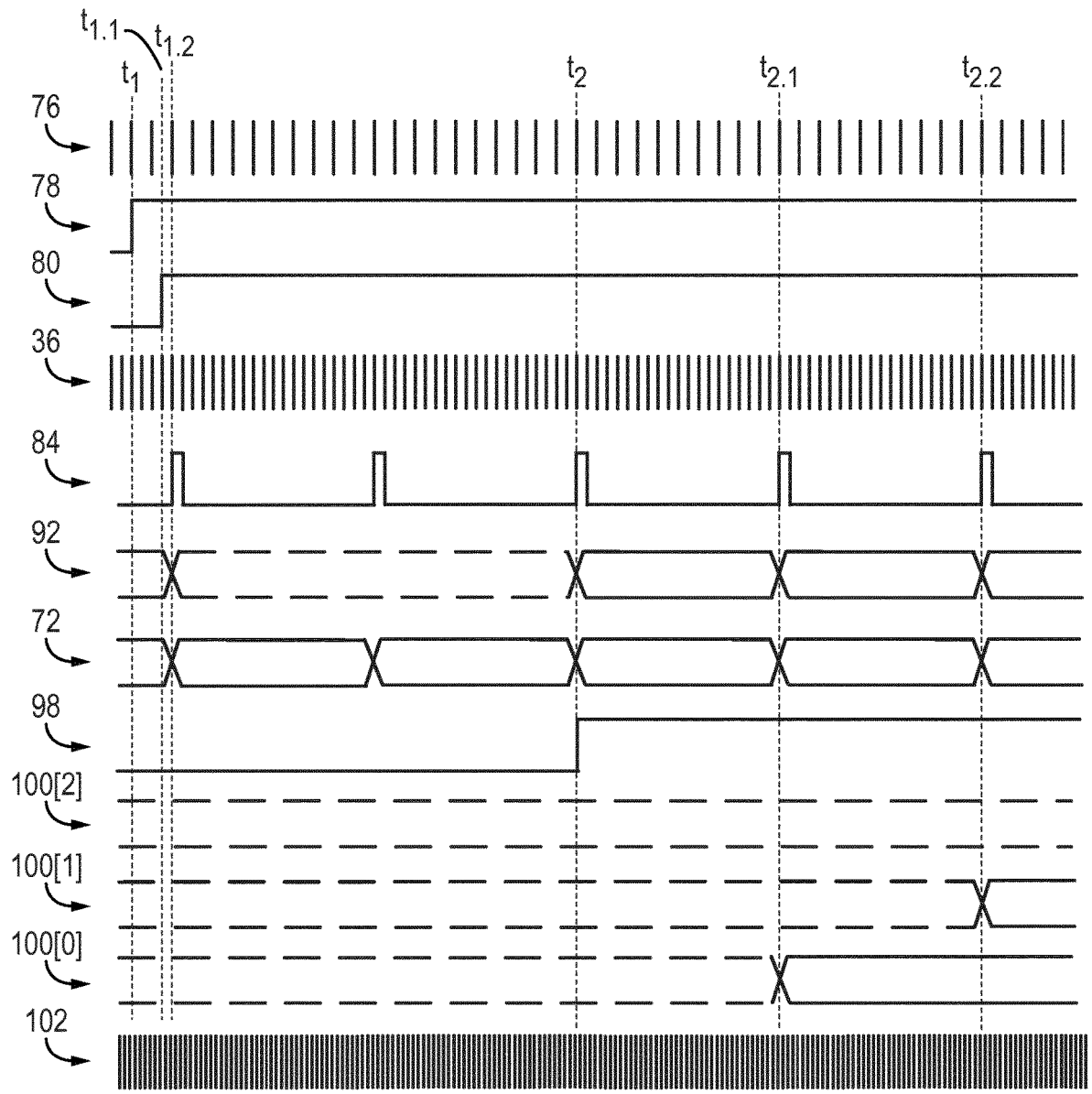
FIG. 3 is a detailed timing diagram further showing the operation of the device of FIG. 1.

FIG. 3 is a detailed timing diagram further showing the operation of the device 2 of FIG. 1. As described previously, the network timer 74 sets the receiver enable signal 78 to logic high at $t_1$. At $t_{1.1}$, the re-synchroniser 70 synchronises the receiver enable signal 78 to the clock domain of the ADCs, i.e. the clock domain set by the ADC clock signal 54 by setting the synchronised receiver signal 80 high. At $t_{1.2}$, the divided clock pulses are generated by the clock divider 68 and output as the decimator clock signal 82 and the sample rate clock signal 84. These clock signals 82, 84 are provided to the decimators 62a, 62b, 62c, the sample rate converters 64a, 64b, 64c, and the sample counter 72, which causes all of these to start to run.

Once the sample counter 72 is running, it counts the pulses of the sample rate clock signal 84. At $t_2$ the count value held by the sample counter 72 reaches the delay value 94 and sets the trigger flag 98 to logic high, thus enabling the FIFO 100.

At $t_{2.1}$ the first valid sample 100[0] is stored to the memory of the FIFO 100 and at $t_{2.2}$ the second sample 100[1] is stored to FIFO 100. Each incoming sample 100[2] is subsequently stored to the FIFO 100 in this manner until the number of samples reaches the sample size value 96, at which point the trigger flag 98 is set to logic low (not shown), disabling the FIFO 100.

These samples are read from the FIFO 100 at the rate set by the baseband clock signal 102. While the reading process is not shown in FIG. 3, those skilled in the art will appreciate that the reading process takes place in the normal way typical of dual-clock asynchronous FIFO devices known in the art per se. However, it should be noted that the baseband clock signal 102 does not need to be synchronous with the ADC clock signal 54 or to the network clock signal 76.

If the network timer 74 were to generate the trigger flag 98 itself, there would be an inaccuracy of the duration of one sample due to it not being synchronised to the ADC clock domain. However, in the receiver device 2 of FIG. 1, the inaccuracy is one period of the ADC clock signal 54, which is typically much shorter than the period of the network clock, for example here it is around twenty times shorter.

Figure 4:
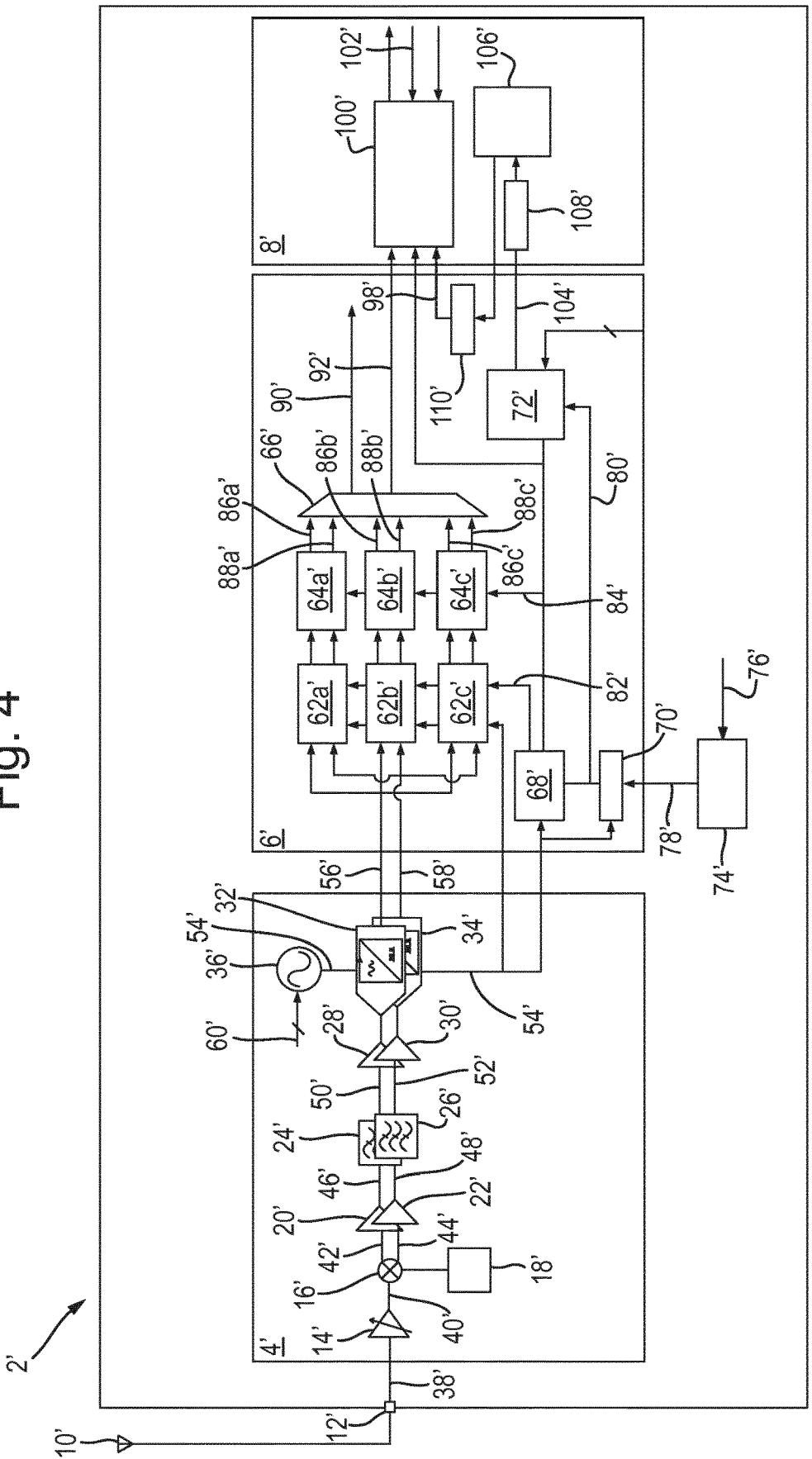
FIG. 4 is a block diagram of a radio receiver device in accordance with a further embodiment of the present invention.

FIG. 4 is a block diagram of a radio receiver device 2' in accordance with a further embodiment of the present invention. The device 2' shown in FIG. 4 is similar to the embodiment described above with reference to FIG. 1, where like reference numerals denote like components.

The difference between the device 2' shown in FIG. 4 and the device 2 described previously is that the sample counter 72' does not directly enable the FIFO 100' and instead provides a count elapsed signal 104' which is output from the digital circuit portion 6'. This count elapsed signal 104' is input to a receive control unit 106' external to the digital circuit portion 6' via a further re-synchroniser 108'.

The difference in functionality is that the sample counter 72' does not control when the sampling process is stopped, and this is instead controlled by the receive control unit 106', which issues the trigger flag 98' (via another re-synchroniser 110') instead of the sample counter 72' issuing it directly.

However, this is not essential as typically the point at which the process is stopped is not as time-critical as when it is started because the baseband circuit portion 8' typically knows how many samples there are in the frame. However, by having the receive control unit 106' handle the stop time instead, the required size of the sample counter 72' may be reduced. The inaccuracy of the device 2' of FIG. 4 is the same as with that of the device 2 of FIG. 1 assuming that the delay through the receive control unit 106' is less than the sample period.

Thus it will be appreciated by those skilled in the art that embodiments of the present invention provide an improved radio receiver device that has improved timing precision compared to conventional receivers without needing to synchronise their internal time bases to the network time base. Furthermore, radio receiver devices in accordance with embodiments of the invention may use a sample counter to suppress the transient response of the digital components. Such radio receivers advantageously may not require that the sample rate be set equal to the network clock frequency, potentially providing savings in terms of power consumption. It will be appreciated by those skilled in the art that the embodiments described above are merely exemplary and are not limiting on the scope of the invention.

The invention claimed is:

1. A radio receiver device arranged to receive a radio signal modulated with a plurality of data symbols from an incoming bitstream, said radio receiver device comprising:
    an analogue circuit portion for connection to an antenna, said analogue circuit portion comprising an analogue-to-digital converter clocked by a first clock signal, wherein the analogue-to-digital converter is arranged to receive the radio signal and produce a digital signal therefrom;
    a digital circuit portion arranged to receive the digital signal produced by the analogue-to-digital converter, said digital circuit portion comprising:
    one or more digital processing units, clocked by a second clock derived from the first clock, said one or more digital processing units being arranged to process the digital signal and produce an output signal therefrom at an output sample rate;
    a sample counter clocked by the second clock such that the sample counter counts a number of samples at the output sample rate, said sample counter being arranged to set a trigger flag when the number of samples exceeds a predetermined threshold value; and
    wherein the radio receiver further comprises a buffer arranged to receive the output signal from the one or more digital processing units, wherein storing of samples to said buffer is enabled only when the trigger flag is set.

2. The radio receiver device as claimed in claim 1, wherein the threshold value is selected such that a transient response of the one or more digital processing units is substantially over before the trigger flag is set.

3. The radio receiver device as claimed in claim 1, wherein the predetermined threshold value is variable.

4. The radio receiver device as claimed in claim 1, further comprising a clock divider arranged to divide the frequency of the first clock by a predetermined scale factor to generate the second clock.

5. The radio receiver device as claimed in claim 4, wherein the clock divider is enabled only when the synchronised receiver enable flag is set.

6. The radio receiver device as claimed in claim 5, wherein the one or more digital processing units comprise at least one decimator and at least one sample rate converter.

7. The radio receiver device as claimed in claim 6, wherein the digital circuit portion comprises a plurality of decimators each connected to a separate sample rate converter, such that each decimator may receive the digital signal from the ADC and produce a respective decimated signal that is input to the corresponding sample rate converter that produces a respective converted signal.

8. The radio receiver device as claimed in claim 6, wherein the decimator(s) is/are clocked by a third clock, said third clock being derived from the first clock, and the sample rate converter(s) are clocked by the second clock.

9. The radio receiver device as claimed in claim 1, further comprising a baseband circuit portion arranged to retrieve the output signal from the buffer, wherein the baseband circuit portion is clocked by a further clock.

10. The radio receiver device as claimed in claim 1, wherein the buffer comprises a first-in-first-out buffer arranged to receive and store the output signal from the digital circuit portion at a write rate, and to retrieve and produce the stored output signal at a read rate.

11. The radio receiver device as claimed in claim 10, wherein the write rate is set by the second clock.

12. The radio receiver device as claimed in claim 9, wherein the buffer comprises a first-in-first-out buffer arranged to receive and store the output signal from the digital circuit portion at a write rate, and to retrieve and produce the stored output signal at a read rate and wherein the read rate is set by the further clock.

13. The radio receiver device as claimed in claim 1, wherein the analogue-to-digital converter is arranged to produce an in-phase digital signal and a quadrature digital signal, wherein the one or more digital processing units are arranged to process both the in-phase and quadrature digital signals.

14. The radio receiver device as claimed in claim 1, wherein the radio signal comprises an LTE signal.

15. A method of operating a radio signal modulated with a plurality of data symbols from an incoming bitstream, wherein the method comprises:
  receiving the radio signal;
  converting the radio signal from analogue to digital, thereby producing a digital signal from said radio signal;
  processing the digital signal and producing an output signal therefrom at an output sample rate;
  counting a number of samples at the output sample rate;
  setting a trigger flag when the number of samples exceeds a predetermined threshold value;
  enabling storing of samples to a buffer arranged to receive the output signal only when the trigger flag is set.

* * * * *